United States Patent
Zhou (10) Patent No.: US 10,686,011 B2
(45) Date of Patent: Jun. 16, 2020

(54) SEMICONDUCTOR DEVICE INTEGRATED WITH MEMORY DEVICE AND FABRICATION METHOD THEREOF

(71) Applicant: United Microelectronics Corp., Hsinchu (TW)

(72) Inventor: Zhi-Biao Zhou, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 153 days.

(21) Appl. No.: 15/909,592

(22) Filed: Mar. 1, 2018

(65) Prior Publication Data
US 2019/0273119 A1 Sep. 5, 2019

(51) Int. Cl.
*H01L 27/24* (2006.01)
*H01L 27/22* (2006.01)
*H01L 29/786* (2006.01)
*H01L 27/11502* (2017.01)

(52) U.S. Cl.
CPC .... *H01L 27/2436* (2013.01); *H01L 27/11502* (2013.01); *H01L 27/228* (2013.01); *H01L 29/7869* (2013.01)

(58) Field of Classification Search
CPC .......................... H01L 27/2436; H01L 27/228
See application file for complete search history.

(56) References Cited

U.S. PATENT DOCUMENTS

| 2007/0166997 | A1* | 7/2007 | Knorr | H01L 21/76898 |
| | | | | 438/622 |
| 2014/0068300 | A1 | 3/2014 | Nishijima et al. | |
| 2017/0141305 | A1* | 5/2017 | Yang | H01L 45/1253 |

FOREIGN PATENT DOCUMENTS

WO 2017111929 6/2017

OTHER PUBLICATIONS

Mohamed T. Ghoneim, et al., "Review on Physically Flexible Nonvolatile Memory for Internet of Everything Electronics," Electronics, vol. 4, No. 3, Jul. 23, 2015, pp. 424-479.
Min-Chen Chen, et al., "Studies on Nonvolatile Resistance Memory Switching Behaviors in InGaZnO Thin Films," 11th Annual Non-Volatile Memory Technology Symposium (NVMTS), Nov. 7-9, 2011, pp. 1-4.
Yang-Shun Fan, et al., "High Endurance and Multilevel Operation in Oxide Semiconductor-Based Resistive RAM Using Thin-Film Transistor as a Selector," ECS Solid State Letters, vol. 4, No. 9, Jun. 27, 2015, pp. Q41-Q43.

* cited by examiner

*Primary Examiner* — Marc Anthony Armand
(74) *Attorney, Agent, or Firm* — J.C. Patents (57) ABSTRACT

A semiconductor device integrated with memory device includes a substrate, having a first side and a second side. A transistor circuit layer is disposed over the substrate at the first side. An interconnect structure layer is disposed over the transistor circuit layer with electric connection to form a circuit route. A memory cell layer is disposed over the interconnect structure layer or over a second side of the substrate, in connection to the circuit route. The memory cell layer includes a plurality of memory cells, and a cell structure of the memory cells includes an oxide semiconductor field effect transistor and a memory element.

20 Claims, 9 Drawing Sheets

SEMICONDUCTOR DEVICE INTEGRATED WITH MEMORY DEVICE AND FABRICATION METHOD THEREOF

BACKGROUND

1. Field of the Invention

The present invention generally relates to semiconductor fabrication technology, and particularly to a semiconductor device integrated with memory cell.

2. Description of Related Art

Memory device such as dynamic random access memory (DRAM) device has been widely used in digital electronic apparatus for storing data. The memory cell usually includes one transistor with one memory element, such as capacitor or resistive memory material, connected to one source/drains (S/D) region for storing binary data.

In conventional design and the fabrication process for the memory cells, the memory cells are fabricated based on a wafer. As the further development in fabrication, the fabrication flow is separated into two stages, including a front end of line (FEOL) stage and a back end of line (BEOL) stage. The FEOL stage is to fabricate the transistor on the wafer. The BEOL stage includes the fabrication of contacts, pads, interconnect wires, vias, dielectric structures, and so on.

Based on the FEOL/BEOL fabrication flow, the DRAM cell conventionally is difficult or complicate to be fabricated in the BEOL stage. How to integrate the memory cell in the BEOL stage for easy fabrication is an issue under development.

SUMMARY OF THE INVENTION

The invention provides a semiconductor device integrated with a memory device, in which the memory cell can be integrated in the BEOL stage. The memory cell allows to be fabricated in the BEOL stage without significantly causing difficulty.

In an embodiment, the invention provides a semiconductor device integrated with a memory device includes a substrate, having a first side and a second side. A transistor circuit layer is disposed over the substrate at the first side. An interconnect structure layer is disposed over the transistor circuit layer with electric connection to form a circuit route. A memory cell layer is disposed over the interconnect structure layer or over a second side of the substrate, in connection to the circuit route. The memory cell layer includes a plurality of memory cells, and a cell structure of the memory cells includes an oxide semiconductor field effect transistor (FET) and a memory element.

In an embodiment, as to the semiconductor device, the memory element comprises one of random access memory (RAM) element, resistive RAM (RRAM) element, phase change RAM (PCRAM) element, magnetoresistive RAM (MRAM) element, and ferroelectric (FeRAM) element.

In an embodiment, as to the semiconductor device, the resistive memory material has two resistance states depending on an electric field applied to the resistive memory material.

In an embodiment, as to the semiconductor device, the memory element is stacked above or under the oxide semiconductor FET.

In an embodiment, as to the semiconductor device, the memory element is coupled with the oxide semiconductor FET in serial connection or parallel connection.

In an embodiment, as to the semiconductor device, the memory cell layer is disposed over the interconnect structure layer at the first side of the substrate.

In an embodiment, as to the semiconductor device, the memory cell layer is disposed over the second side of the substrate, wherein the interconnect structure layer comprises a through substrate via structure in the substrate to extend the interconnect structure layer to the second side of the substrate to connect the memory cell layer.

In an embodiment, as to the semiconductor device, the transistor circuit layer comprises a plurality of transistors, dispose on the substrate.

In an embodiment, as to the semiconductor device, the substrate is a silicon wafer.

In an embodiment, as to the semiconductor device, the interconnect structure layer comprises a plurality of metal layers at different levels.

In an embodiment, the invention provides a method for fabricating a semiconductor device integrated with a memory device, comprising providing a substrate, having a first side and a second side. Then, a transistor circuit layer is formed over the substrate at the first side. An interconnect structure layer is formed over the transistor circuit layer with electric connection to form a circuit route. A memory cell layer is disposed over the interconnect structure layer or over a second side of the substrate, in connection to the circuit route. The memory cell layer is formed comprising a plurality of memory cells, and a cell structure of the memory cells comprises an oxide semiconductor field effect transistor and a memory element.

In an embodiment, as to the method for fabricating the semiconductor device, the memory element is formed comprising one of random access memory (RAM) element, resistive RAM (RRAM) element, phase change RAM (PCRAM) element, magnetoresistive RAM (MRAM) element, and ferroelectric (FeRAM) element.

In an embodiment, as to the method for fabricating the semiconductor device, the resistive memory material has two resistance states depending on an electric field applied to the resistive memory material.

In an embodiment, as to the method for fabricating the semiconductor device, the memory element is formed by stacking above or under the oxide semiconductor FET.

In an embodiment, as to the method for fabricating the semiconductor device, the memory element is coupled with the oxide semiconductor FET in serial connection or parallel connection.

In an embodiment, as to the method for fabricating the semiconductor device, the memory cell layer is formed by disposing over the interconnect structure layer at the first side of the substrate.

In an embodiment, as to the method for fabricating the semiconductor device, the memory cell layer is formed by disposing over the second side of the substrate, wherein the step of forming the interconnect structure layer further comprises forming a through substrate via structure in the substrate to extend the interconnect structure layer to the second side of the substrate to connect the memory cell layer.

In an embodiment, as to the method for fabricating the semiconductor device, the transistor circuit layer is formed comprising a plurality of transistors, dispose on the substrate.

In an embodiment, as to the method for fabricating the semiconductor device, the substrate is a silicon wafer.

In an embodiment, as to the method for fabricating the semiconductor device, the interconnect structure layer is formed comprising a plurality of metal layers at different levels.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to semiconductor integrated with memory device, in which the memory cell is integrated at the BEOL stage and can be easily fabricated.

Several embodiments are provided for describing the invention but the invention is not limited to embodiments as provided. It should be also noted that the drawing is to schematically show the features but not the actual scale of the device.

Figure 1:
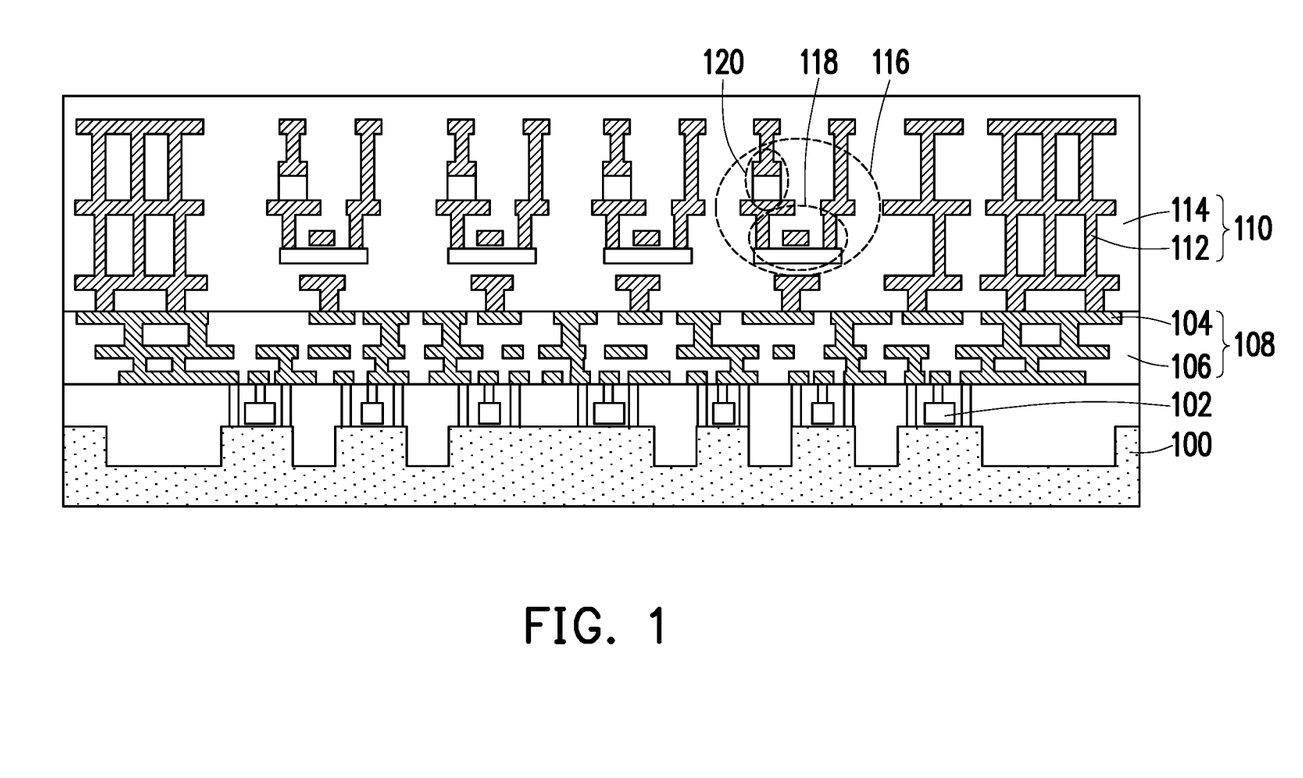
FIG. 1 is a cross-sectional drawing, schematically illustrating a semiconductor device integrated with a memory device, according to an embodiment of the invention.

FIG. 1 is a cross-sectional drawing, schematically illustrating a semiconductor device integrated with a memory device, according to an embodiment of the invention.

Referring to FIG. 1, a transistor circuit layer 102 including a plurality of transistors are formed over the substrate 100 during FEOL stage in an example, and then the interconnect structure layer 108 is formed over the transistor circuit layer 102. As usually known in semiconductor fabrication, the several dielectric layers with respect to different levels of metal layers in fabrication are involved to form the interconnect structure layer 104. These inter dielectric layers here are together referred as an inter-layer dielectric 106 without specific distinguishing each layer in stack.

The interconnect structure layer 108 includes interconnect structure to form a circuit route 104, which is enclosed by the inter-layer dielectric 106. The interconnect structure layer 108 so-far provides a flat plane for further fabrication. In the invention, a memory cell layer 110 can be integrated by forming the memory cells 116 with circuit route 112, such as another interconnect structure, and the inter-layer dielectric 114. The circuit route 112 provides the connection route between the memory cells 116 and the transistor circuit layer 102 to form the full circuit structure.

The memory cells 116 in the invention is fabricated a part of the BEOL stage. The memory cells 116 includes a control transistor such as an oxide semiconductor FET 118 and a memory element 120. As a result, the memory cells 116 are fabricated in the BEOL stage without causing difficulty. A semiconductor device integrated with the memory cells 116 can be relatively easier in fabrication.

Figure 2:
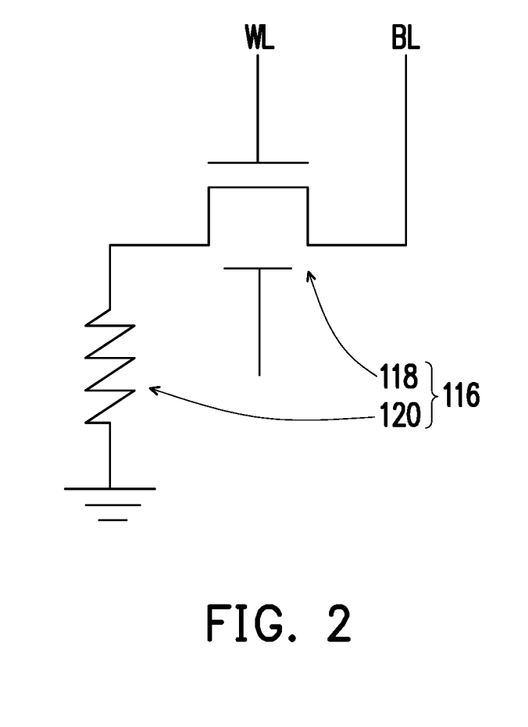
FIG. 2 is a drawing, schematically illustrating a circuit structure of a resistive RAM cell, according to an embodiment of the invention.

FIG. 2 is a drawing, schematically illustrating a circuit structure of a resistive RAM cell, according to an embodiment of the invention. Referring to FIG. 2 and FIG. 1, taking a resistive RAM (RRAM) cell as an example, the circuit structure of the memory cell 116 includes the oxide semiconductor FET 118 and the memory element 120. The memory element 120 in the example is resistive memory material, connected to a source/drain (S/D) terminal of the oxide semiconductor FET 118. The resistive memory material has two resistance states depending on an electric field applied to the resistive memory material, and can store one bit. A gate of the oxide semiconductor FET 118 is control by a word line (WL) and another S/D terminal is controlled by bit line (BL). As seen in FIG. 1, the memory element 120 is fabricated above the oxide semiconductor FET 118 in connecting to another S/D terminal. The structure of the oxide semiconductor FET 118 is to be described later in FIG. 7. Since the resistive memory material of the memory element 120 can to resistance states, the voltage at the bit line (BL) can be detected in read operation, as the usual operation. The programming and erasing mechanisms can follow the known procedure without specific limitation.

Figure 3:
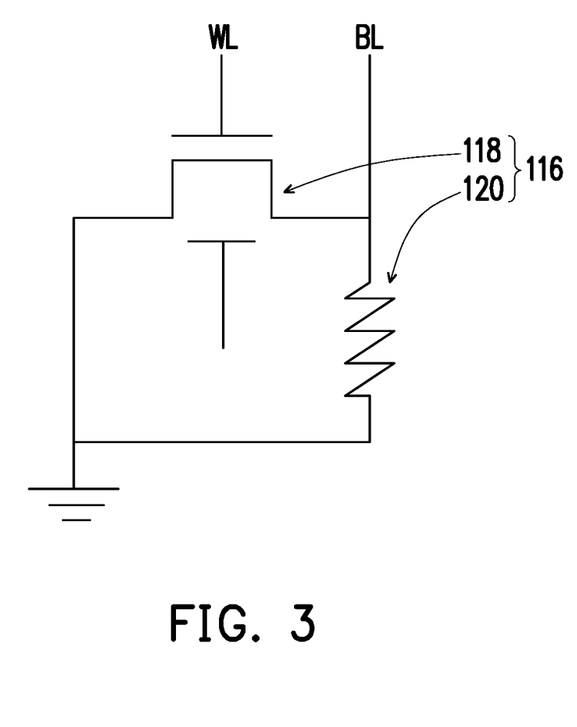
FIG. 3 is a drawing, schematically illustrating a circuit structure of a resistive RAM cell, according to an embodiment of the invention.

The circuit of the memory cell 116 can be modified. FIG. 3 is a drawing, schematically illustrating a circuit structure of a resistive RAM cell, according to an embodiment of the invention.

Referring to FIG. 3, in this memory circuit, the memory element 120 is coupled in parallel with the oxide semiconductor FET 118. It can also produce two distinguishing resistance states for storing one bit.

Figure 4:
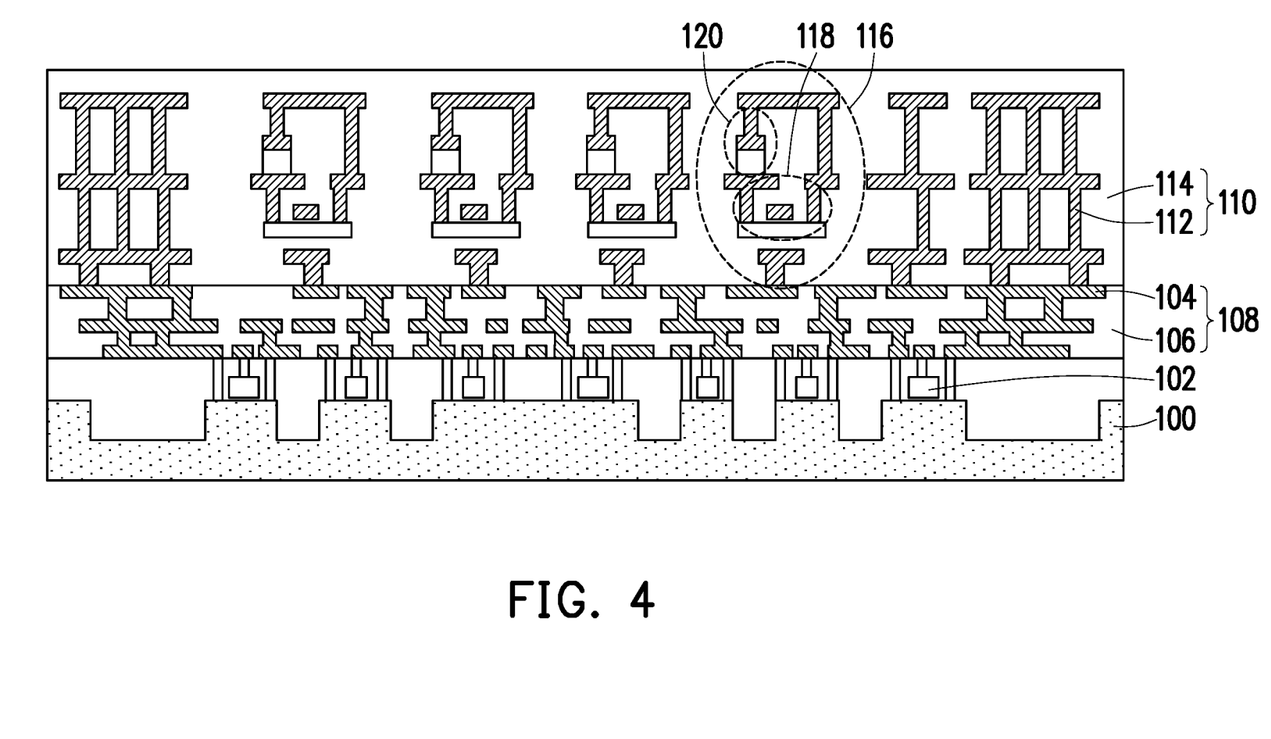
FIG. 4 is a cross-sectional drawing, schematically illustrating a semiconductor device integrated with a memory device, according to an embodiment of the invention.

Since the memory circuit is modified, the semiconductor structure for the memory cell 116 is also modified. FIG. 4 is a cross-sectional drawing, schematically illustrating a semiconductor device integrated with a memory device, according to an embodiment of the invention. A ground metal layer connects one S/D terminal of the oxide semiconductor FET 118 and the memory element 120, which is further connected to another S/D terminal of the oxide semiconductor FET 118, in an example. The memory element 120 in this embodiment is above the oxide semiconductor FET 118.

Figure 5:
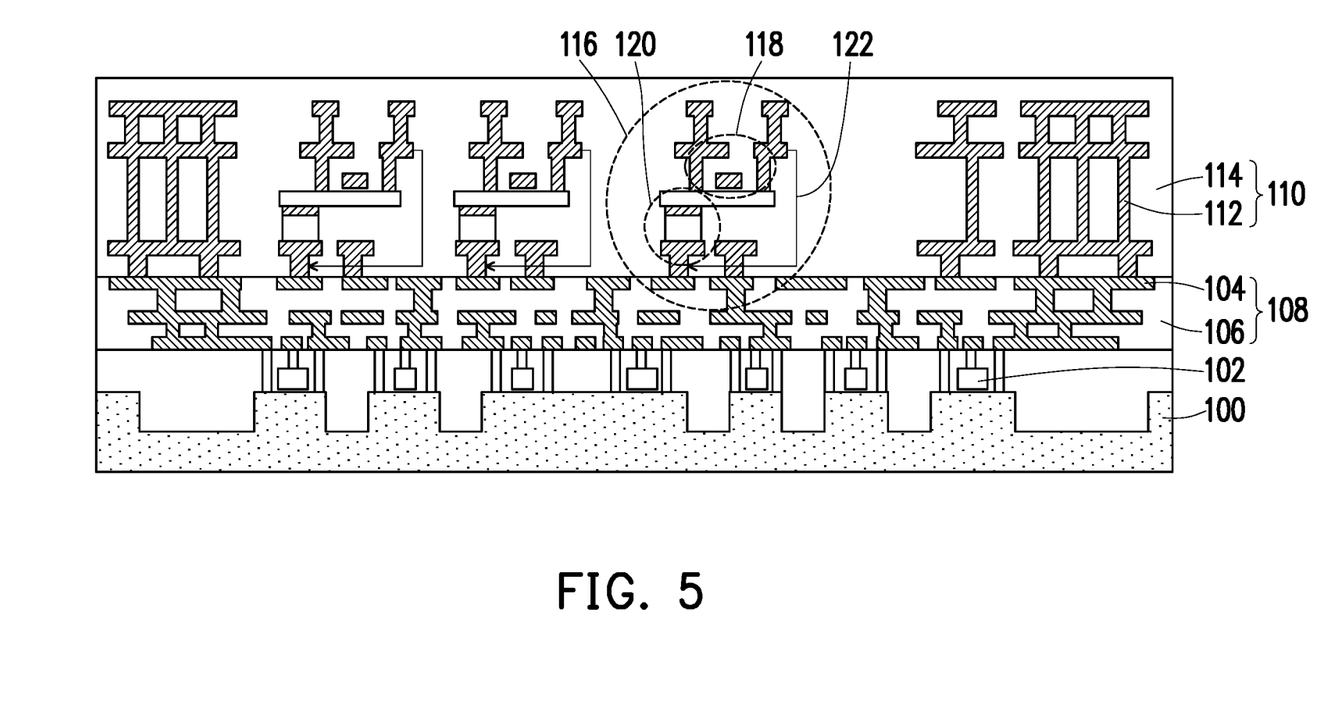
FIG. 5 is a cross-sectional drawing, schematically illustrating a semiconductor device integrated with a memory device, according to an embodiment of the invention.

However, the semiconductor fabrication can be further modified. FIG. 5 is a cross-sectional drawing, schematically illustrating a semiconductor device integrated with a memory device, according to an embodiment of the invention. Referring to FIG. 5 in an embodiment, the memory element 120 can be disposed under the oxide semiconductor FET 118. In this situation, the circuit route 112 is accordingly adjusted with proper connection to form the memory circuit, in which the sub circuit rout 122 indicated by line does exist as a part of the circuit rout 112 but not actually seen in this cross-sectional view. The semiconductor structure can be slightly modified based on the formation of actual memory circuit. The invention is not limited to the specific interconnection structure.

Figure 6:
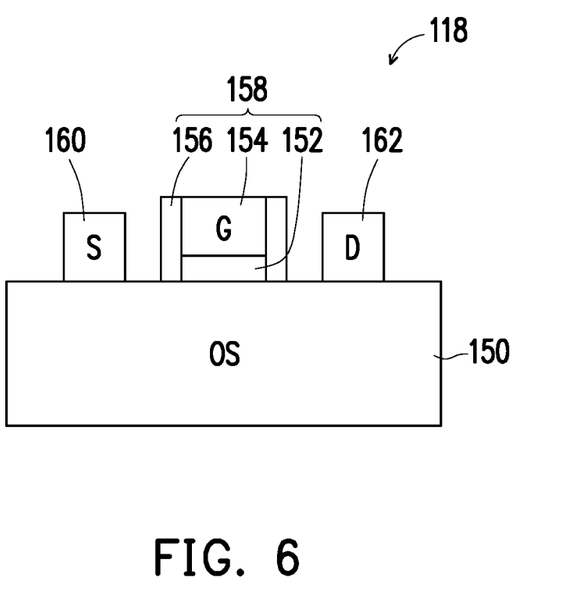
FIG. 6 is a cross-sectional drawing, schematically illustrating an oxide semiconductor FET.

FIG. 6 is a cross-sectional drawing, schematically illustrating an oxide semiconductor FET. Referring to FIG. 6, in an example, the oxide semiconductor FET 118 has a basic structure including the oxide semiconductor layer 150, serving as a device substrate for proving the channel function. A gate structure 158 is then formed on the oxide semiconductor layer 150. As usual in an example, the gate structure 158 may include the gate insulating layer 152, gate layer (G) 154 on the gate insulating layer 152, and the spacer 156 on the sidewalls of the gate layer 154, merging with the gate insulating layer 152. The source terminal (S) and the drain terminal (D) are formed on the oxide semiconductor layer 150 at both sides of the gate structure 158. However, the oxide semiconductor layer FET 118 is not limited to the embodiment in FIG. 6. The additional modified structure can be included. The gate layer 154 can also include multiple layer in stack.

The memory cells 116 in the invention is formed by oxide semiconductor FET 118 with the memory element 120, so the memory cells 116 can be easily adapted in the BEOL stage to integrate the memory cells 116. However, the memory cells 116 is not limited to the RRAM cell. In other example, the memory cells 116 can be phase change RAM (PCRAM), magnetoresistive RAM (MRAM), or ferroelectric (FeRAM), or any proper memory, as an example, without limit to a specific type. The memory cells 116 in the invention is not limited to a specific type. The transistors involved in the memory cells 116 can be formed by oxide semiconductor FET.

It can be further noted that the embodiments above have the memory cell layer 110 over the interconnect structure layer 108 at front side of the substrate 100. However, the memory cell layer 110 can also be formed over another side, or back side, of the substrate 100.

Figure 7:
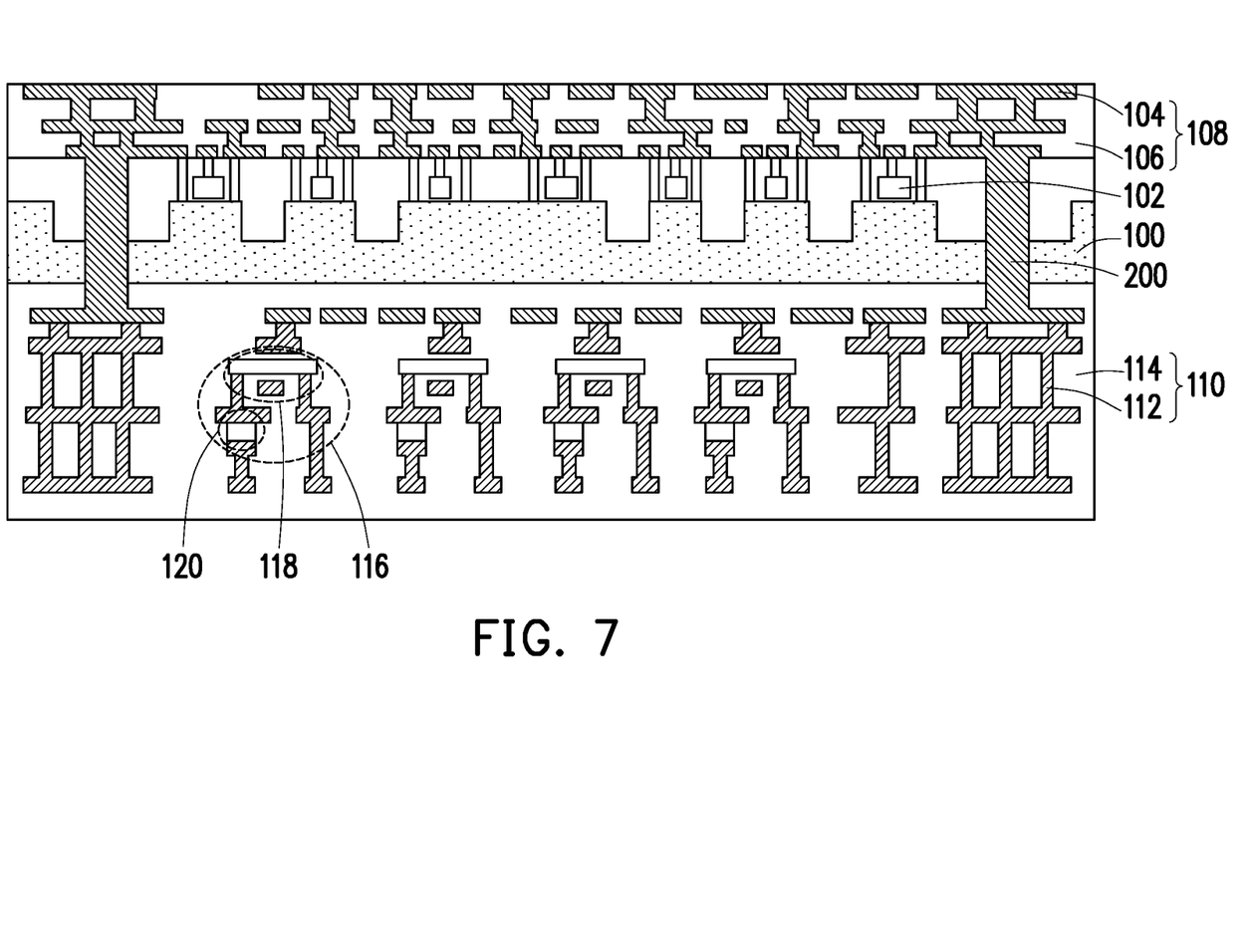
FIG. 7 is a cross-sectional drawing, schematically illustrating a semiconductor device integrated with a memory device, according to an embodiment of the invention.

FIG. 7 is a cross-sectional drawing, schematically illustrating a semiconductor device integrated with a memory device, according to an embodiment of the invention. Referring to FIG. 7, in the embodiment, the memory cell layer 110 can be disposed over another side, that is, backside of the substrate 100. However, the interconnect structure layer 108 further includes a through substrate via (TSV) structure 200 in the substrate 100 to extend the interconnect structure layer 108 to the backside of the substrate 100 to connect the memory cell layer 110. The location and number of the TSV structure is not just limited to the embodiment, which is schematically describing the invention. The memory cell layer 110 in the embodiment is similar to the memory cell layer 110 in FIG. 1, in which the memory cells 116 includes a control transistor such as oxide semiconductor FET 118 and a memory element 120. The memory element 120 is above the oxide semiconductor FET 118, outward the substrate 100.

Figure 8:
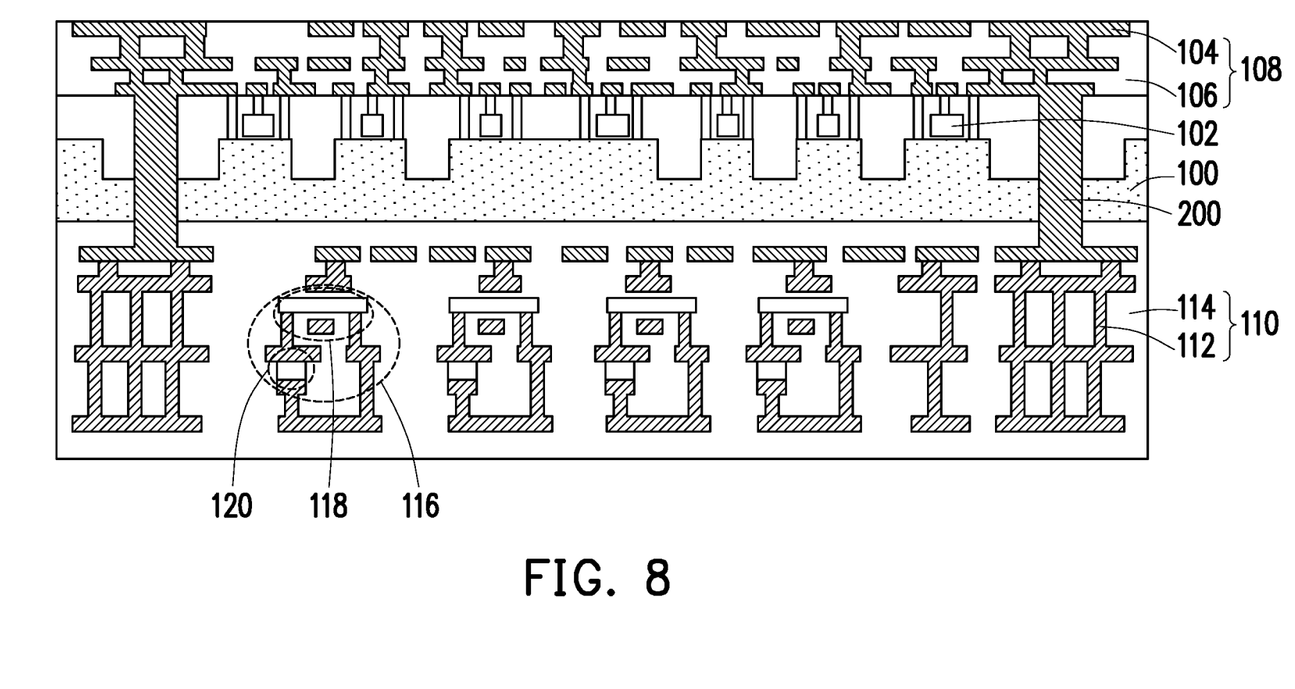
FIG. 8 is a cross-sectional drawing, schematically illustrating a semiconductor device integrated with a memory device, according to an embodiment of the invention.

Likewise, FIG. 8 is a cross-sectional drawing, schematically illustrating a semiconductor device integrated with a memory device, according to an embodiment of the invention. Referring to FIG. 8, the memory cell layer 110 in the embodiment is similar to the memory cell layer 110 in FIG. 4 with the memory circuit in FIG. 3, in which the memory cells 116 also includes a control transistor such as an oxide semiconductor FET 118 and a memory element 120. The memory element 120 is above the oxide semiconductor FET 118, outward the substrate 100. The TSV structure 200 is also involved for interconnection as stated in FIG. 7.

Figure 9:
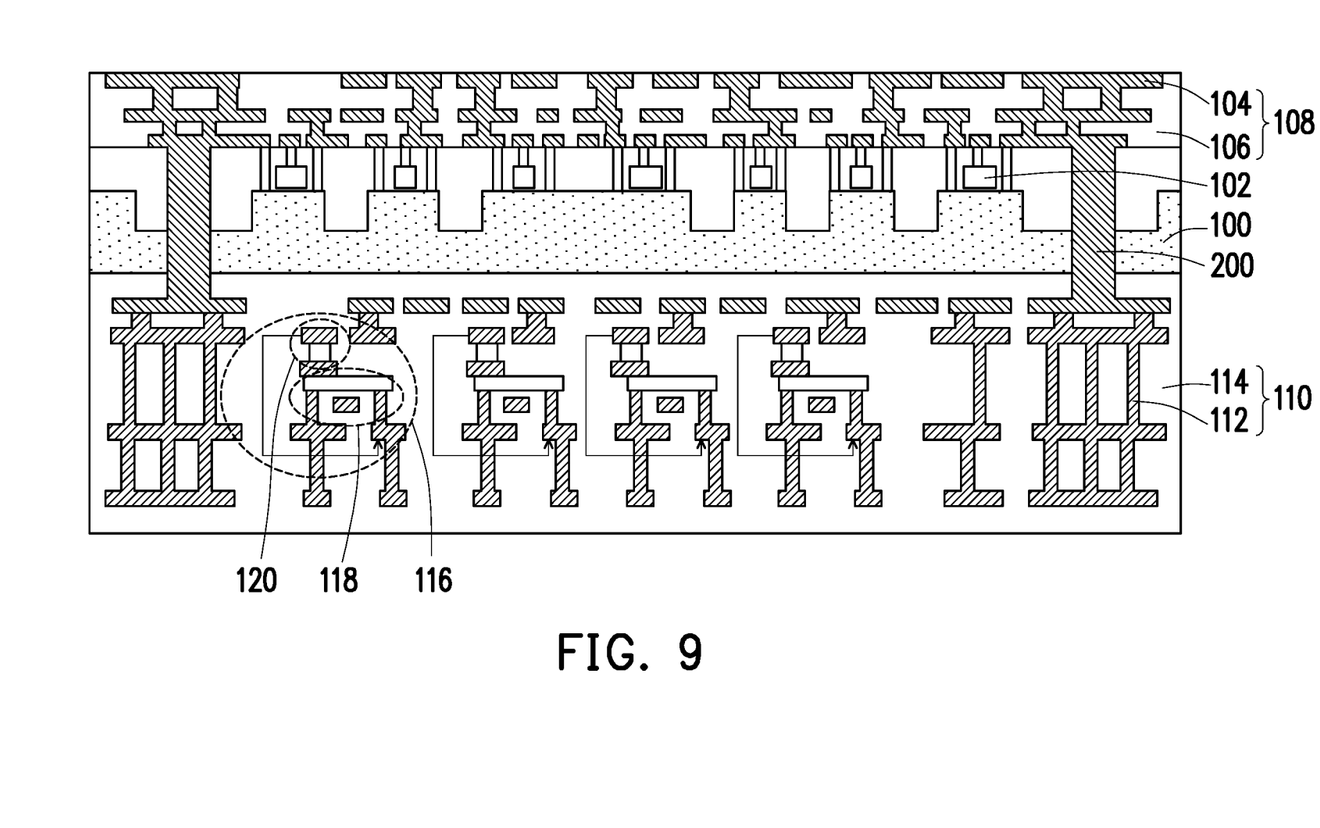
FIG. 9 is a cross-sectional drawing, schematically illustrating a semiconductor device integrated with a memory device, according to an embodiment of the invention.
Figure 10:
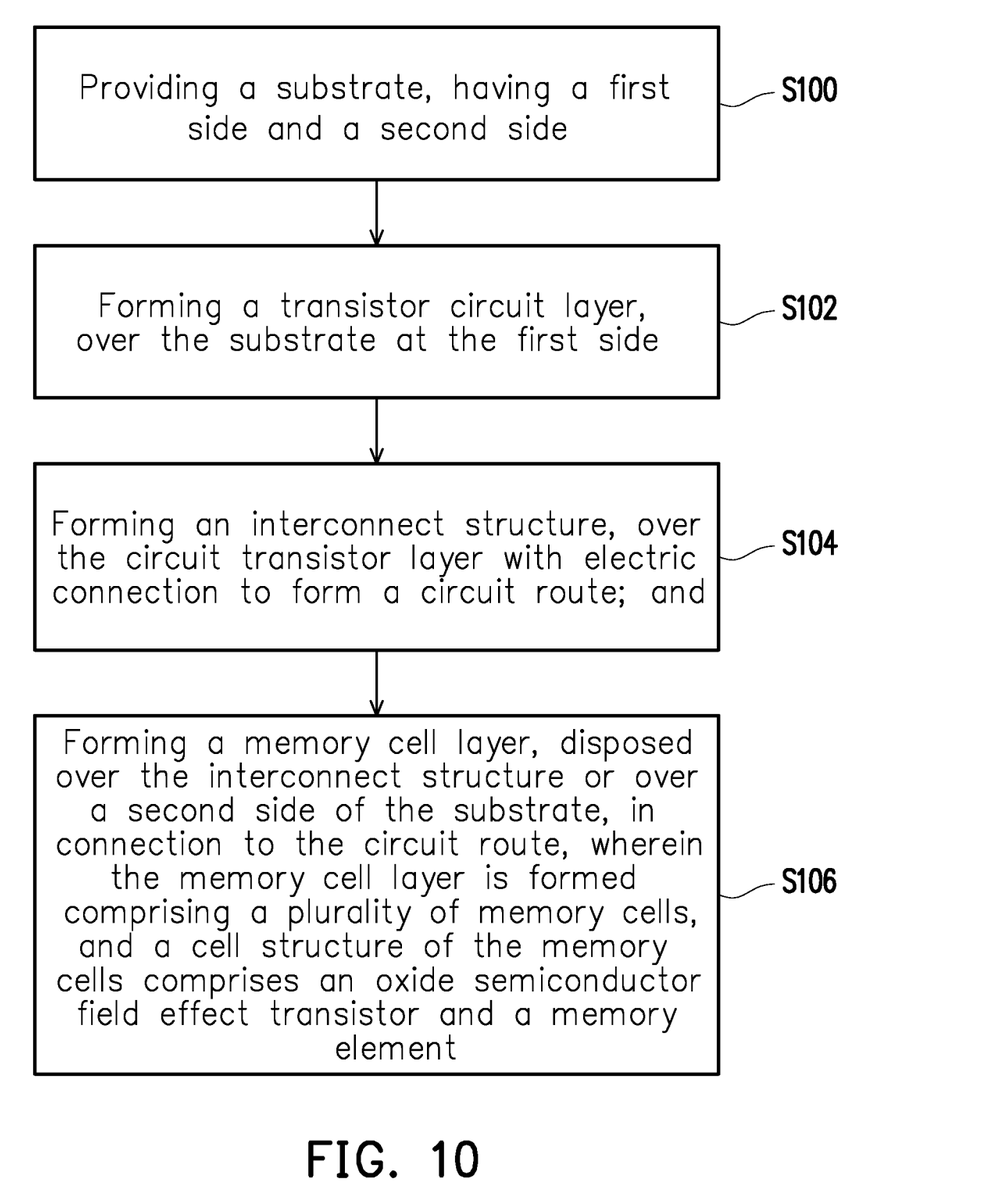
FIG. 10 is a flow diagram, schematically illustrating a method for fabricating a semiconductor device integrated with a memory device, according to an embodiment of the invention.

Further, FIG. 9 is a cross-sectional drawing, schematically illustrating a semiconductor device integrated with a memory device, according to an embodiment of the invention. Referring to FIG. 9, similar to FIG. 7 and FIG. 8, the memory cell layer 110 in the embodiment is formed on the backside of the substrate 100. The memory cell layer 110 in this embodiment is similar to the structure in FIG. 5, in which the memory element 120 is under the oxide semiconductor FET 118, toward the substrate 100.

The invention allows a semiconductor device to be integrated with memory cells. In an example, the semiconductor device can be a memory apparatus. The memory cell layer 110 in the invention can be fabricated in the BEOL stage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device integrated with memory device, comprising:
    a substrate, having a first side and a second side;
    a transistor circuit layer, disposed over the substrate at the first side;
    an interconnect structure layer, disposed over the transistor circuit layer with electric connection to form a circuit route; and
    a memory cell layer, disposed over the interconnect structure layer or over the second side of the substrate, in connection to the circuit route,
    wherein the memory cell layer comprises a plurality of memory cells, and a cell structure of the memory cells comprises an oxide semiconductor field effect transistor (FET) and a memory element,
    wherein the oxide semiconductor field effect transistor is distant from the substrate.

2. The semiconductor device in claim 1, wherein the memory element comprises one of random access memory (RAM) element, resistive RAM (RRAM) element, phase change RAM (PCRAM) element, magnetoresistive RAM (MRAM) element, and ferroelectric (FeRAM) element.

3. The semiconductor device in claim 2, wherein the resistive memory material has two resistance states depending on an electric field applied to the resistive memory material.

4. The semiconductor device in claim 1, wherein the memory element is stacked above or under the oxide semiconductor FET.

5. The semiconductor device in claim 1, wherein the memory element is coupled with the oxide semiconductor FET in serial connection or parallel connection.

6. The semiconductor device in claim 1, wherein the memory cell layer is disposed over the interconnect structure layer at the first side of the substrate.

7. The semiconductor device in claim 1, wherein the memory cell layer is disposed over the second side of the substrate, wherein the interconnect structure layer comprises a through substrate via (TSV) structure in the substrate to extend the interconnect structure layer to the second side of the substrate to connect the memory cell layer.

8. The semiconductor device in claim 1, wherein the transistor circuit layer comprises a plurality of transistors, dispose on the substrate.

9. The semiconductor device in claim 1, wherein the substrate is a silicon wafer.

10. The semiconductor device in claim 1, wherein the interconnect structure layer comprises a plurality of metal layers at different levels.

11. A method for fabricating semiconductor device integrated with memory device, comprising:
providing a substrate, having a first side and a second side;
forming a transistor circuit layer, over the substrate at the first side;
forming an interconnect structure layer, over the transistor circuit layer with electric connection to form a circuit route; and
forming a memory cell layer, disposed over the interconnect structure layer or over the second side of the substrate, in connection to the circuit route,
wherein the memory cell layer is formed comprising a plurality of memory cells, and a cell structure of the memory cells comprises an oxide semiconductor field effect transistor (FET) and a memory element,
wherein the oxide semiconductor field effect transistor is distant from the substrate.

12. The method of claim 11, wherein the memory element is formed comprising one of random access memory (RAM) element, resistive RAM (RRAM) element, phase change RAM (PCRAM) element, magnetoresistive RAM (MRAM) element, and ferroelectric (FeRAM) element.

13. The method of claim 12, wherein the resistive memory material has two resistance states depending on an electric field applied to the resistive memory material.

14. The method of claim 11, wherein the memory element is formed by stacking above or under the oxide semiconductor FET.

15. The method of claim 11, wherein the memory element is coupled with the oxide semiconductor FET in serial connection or parallel connection.

16. The method of claim 11, wherein the memory cell layer is formed by disposing over the interconnect structure layer at the first side of the substrate.

17. The method of claim 11, wherein the memory cell layer is formed by disposing over the second side of the substrate, wherein the step of forming the interconnect structure layer further comprises:
forming a through substrate via (TSV) structure in the substrate to extend the interconnect structure layer to the second side of the substrate to connect the memory cell layer.

18. The method of claim 11, wherein the transistor circuit layer is formed comprising a plurality of transistors, dispose on the substrate.

19. The method of claim 11, wherein the substrate is a silicon wafer.

20. The method of claim 11, wherein the interconnect structure layer is formed comprising a plurality of metal layers at different levels.

* * * * *